(12) United States Patent
Lewis et al.

(10) Patent No.: US 9,054,262 B2
(45) Date of Patent: Jun. 9, 2015

(54) INTEGRATED OPTICAL UPCONVERSION DEVICES AND RELATED METHODS

(71) Applicant: Research Triangle Institute, Research Triangle Park, NC (US)

(72) Inventors: John Lewis, Durham, NC (US); Ethan Klem, Durham, NC (US)

(73) Assignee: Research Triangle Institute, Durham, NC (US)

( * ) Notice: Subject to any disclaimer, the term of this patent is extended or adjusted under 35 U.S.C. 154(b) by 0 days.

(21) Appl. No.: 14/216,296

(22) Filed: Mar. 17, 2014

(65) Prior Publication Data

US 2015/0008390 A1  Jan. 8, 2015

Related U.S. Application Data

(63) Continuation-in-part of application No. 13/499,038, filed as application No. PCT/US2010/050731 on Sep. 29, 2010, now Pat. No. 8,742,398.

(60) Provisional application No. 61/800,333, filed on Mar. 15, 2003, provisional application No. 61/312,494, filed on Mar. 10, 2010, provisional application No. 61/246,679, filed on Sep. 29, 2009.

(51) Int. Cl.
| | |
|---|---|
| *H01L 31/00* | (2006.01) |
| *H01L 31/12* | (2006.01) |
| *H01L 31/167* | (2006.01) |

(52) U.S. Cl.
CPC .............. *H01L 31/12* (2013.01); *H01L 31/167* (2013.01)

(58) Field of Classification Search
CPC ............................ H01L 31/12; H01L 31/167
USPC .................... 257/21, 90, 94, 96, 97, 233, 292
See application file for complete search history.

(56) References Cited

U.S. PATENT DOCUMENTS

| | | | |
|---|---|---|---|
| 4,965,649 A | 10/1990 | Zanio et al. | |
| 4,995,049 A * | 2/1991 | Kahen et al. | 372/50.1 |
| 5,077,593 A | 12/1991 | Sato et al. | |
| 5,505,928 A | 4/1996 | Alivisatos et al. | |
| 5,787,215 A * | 7/1998 | Kuhara et al. | 385/88 |
| 5,949,064 A | 9/1999 | Chow et al. | |
| 6,207,229 B1 | 3/2001 | Bawendi et al. | |

(Continued)

FOREIGN PATENT DOCUMENTS

| | | |
|---|---|---|
| EP | 2432015 A1 | 3/2012 |
| JP | 2004165516 A | 6/2004 |

(Continued)

OTHER PUBLICATIONS

Bjorstrom et al., "Multilayer Formation in Spin-Coated Thin Films of Low-Bandgap Polyfluorene:PCBM Blends," J. Phy.: Condens. Matter, vol. 17, 2005, L529-L534.

(Continued)

*Primary Examiner* — Brook Kebede
(74) *Attorney, Agent, or Firm* — David P. Gloekler

(57) ABSTRACT

Integrated upconversion devices capable of upconverting incident visible to short wavelength infrared photons to visible photons are disclosed. The device may include a quantum dot-based photodiode and a light-emitting diode. The device may further include a gain element such as a thin-film transistor.

25 Claims, 9 Drawing Sheets

(56) References Cited

U.S. PATENT DOCUMENTS

| | | |
|---|---|---|
| 6,300,612 B1 | 10/2001 | Yu |
| 6,329,668 B1 | 12/2001 | Razeghi |
| 6,455,872 B1 | 9/2002 | Williams et al. |
| 6,504,196 B1 | 1/2003 | Rhodes |
| 6,580,027 B2 | 6/2003 | Forrest et al. |
| 6,710,366 B1 | 3/2004 | Lee et al. |
| 6,852,920 B2 | 2/2005 | Sager et al. |
| 6,878,871 B2 | 4/2005 | Scher et al. |
| 6,906,326 B2 | 6/2005 | Koch et al. |
| 6,972,431 B2 | 12/2005 | Forrest et al. |
| 7,042,029 B2 | 5/2006 | Graetzel et al. |
| 7,326,908 B2 | 2/2008 | Sargent et al. |
| 7,391,024 B2 | 6/2008 | Garber et al. |
| 7,459,686 B2 | 12/2008 | Syllaios et al. |
| 7,773,404 B2 | 8/2010 | Sargent et al. |
| 7,923,801 B2 | 4/2011 | Tian et al. |
| 8,004,057 B2 | 8/2011 | Tian et al. |
| 8,013,412 B2 | 9/2011 | Tian |
| 8,102,693 B2 | 1/2012 | Sargent et al. |
| 8,115,232 B2 | 2/2012 | Sargent et al. |
| 8,138,567 B2 | 3/2012 | Ivanov et al. |
| 8,203,195 B2 | 6/2012 | Ivanov et al. |
| 8,284,587 B2 | 10/2012 | Sargent et al. |
| 8,422,266 B2 | 4/2013 | Sargent et al. |
| 8,441,090 B2 | 5/2013 | Tian et al. |
| 8,450,138 B2 | 5/2013 | Sargent et al. |
| 8,466,533 B2 | 6/2013 | Tian et al. |
| 8,476,616 B2 | 7/2013 | Sargent et al. |
| 8,513,758 B2 | 8/2013 | Tian et al. |
| 8,530,991 B2 | 9/2013 | Tian et al. |
| 8,530,992 B2 | 9/2013 | Tian et al. |
| 8,530,993 B2 | 9/2013 | Tian et al. |
| 2001/0028055 A1 | 10/2001 | Fafard et al. |
| 2006/0032530 A1 | 2/2006 | Afzali-Ardakani et al. |
| 2006/0138396 A1 | 6/2006 | Lin et al. |
| 2006/0243959 A1 | 11/2006 | Sargent et al. |
| 2007/0025139 A1 | 2/2007 | Parsons |
| 2007/0096078 A1 | 5/2007 | Lee et al. |
| 2007/0215860 A1 | 9/2007 | Komiyama et al. |
| 2008/0048102 A1 | 2/2008 | Kurtz et al. |
| 2008/0128021 A1 | 6/2008 | Choudhury et al. |
| 2008/0178924 A1 | 7/2008 | Kempa et al. |
| 2008/0202581 A1 | 8/2008 | Kempa |
| 2008/0216894 A1 | 9/2008 | Hammond |
| 2008/0230120 A1 | 9/2008 | Reddy |
| 2009/0101953 A1 | 4/2009 | Hayashi et al. |
| 2010/0314529 A1 | 12/2010 | Sargent et al. |
| 2011/0297915 A1 | 12/2011 | Tian et al. |
| 2012/0037789 A1 | 2/2012 | Tian et al. |
| 2012/0037887 A1 | 2/2012 | Tian et al. |
| 2012/0056289 A1 | 3/2012 | Tian et al. |
| 2012/0208315 A1 | 8/2012 | Sargent et al. |
| 2012/0223291 A1 | 9/2012 | Klem et al. |
| 2012/0241723 A1 | 9/2012 | Klem et al. |
| 2013/0228749 A1 | 9/2013 | Sargent et al. |
| 2013/0244366 A1 | 9/2013 | Sargent et al. |

FOREIGN PATENT DOCUMENTS

| | | |
|---|---|---|
| JP | 2008509559 A | 3/2008 |
| JP | 2009076668 A | 4/2009 |
| JP | 2009099866 A | 5/2009 |
| JP | 2009532851 A | 9/2009 |
| WO | 2006017530 A1 | 2/2006 |
| WO | 2007098378 A1 | 8/2007 |
| WO | 2008131313 A3 | 10/2008 |
| WO | 2013003850 A2 | 1/2013 |

OTHER PUBLICATIONS

Dissanayake, et al.; The fabrication and analysis of a PbS nanocrystal: C60 bilayer hybrid photovoltaic system; Nanotechnology 20; 2009; pp. 245202-1-245202-5.

Dissanayake, et al.; Organic: PbS-nanocrystal: Fullerene Hybrid Phtovoltaics; Mater. Res. Soc. Symp. Proc., 2008; vol. 1102; pp. 1102-LL07-06.

U.S. Non-final Office Action for related U.S. Appl. No. 13/499,024 mailed Jul. 8, 2013, and references cited therein.

Notice of Allowance for related U.S. Appl. No. 13/499,024 mailed Dec. 31, 2013.

(Notice of Allowance for related U.S. Appl. No. 13/499,038 mailed Oct. 2, 2013.

Notice of Allowance for related U.S. Appl. No. 13/499,038 mailed Jan. 17, 2014.

International Preliminary Report on Patentability dated Apr. 12, 2012 for PCT/US2010/050712.

International Preliminary Report on Patentability dated Apr. 12, 2012 for PCT/US2010/050731.

International Search Report for PCT/US2010/050731 dated Jul. 29, 2010.

International Search Report for PCT/US2010/050712 dated Sep. 29, 2010.

Int'l Search Report and Written Opinion mailed Dec. 13, 2010 for corresponding Int'l. Patent Application No. PCT/US2010/050731 and references cited therein.

Japanese office action and translation dated Jul. 25, 2013 for Japanese Patent Application No. 2012-531121 and references cited therein.

Japanese Office Action translation dated Aug. 19, 2013 for Japanese Patent Application No. 2012-531123 and references cited therein.

Kim et al., "Contact Printing of Quantum Dot Light-Emitting Devices," Nano Letters, American Chemical Society, 2008.

Liu, "Quantum Dot Infrared Photodetector," Opto-Electronics Review, vol. 11, No. 1, pp. 1-5, 2003.

Mcbranch et al., Optical Limiting in Fullerene Solutions and Doped Glasses,: SPIE Proceedings, "Fullerenes and Photonics II," San Diego, CA 1985.

Osedach et al., "Lateral Heterojunction Photodetector Consisting of Molecular Organic and Colloidal Quantum Dot Thin Films," Applied Physics Letters, vol. 94, 043307, 2009.

Rausch et al., "Near-Infrared Imaging with Quantum-Dot-Sensitized Organic Photodiodes," Nature Photonics, vol. 3, Jun. 2009.

Sargent, "Infrared Photovoltaics Made by Solution Processing," Nature Photonics, vol. 3, Jun. 2009.

Wu et al., "Programmable Organic Light-Emitting Devices," Applied Physics Letters, vol. 79, No. 19, Nov. 5, 2001.

\* cited by examiner

INTEGRATED OPTICAL UPCONVERSION DEVICES AND RELATED METHODS

RELATED APPLICATIONS

This application claims the benefit of U.S. Provisional Application No. 61/800,333, filed Mar. 15, 2013, titled "INTEGRATED OPTICAL UPCONVERSION DEVICES AND RELATED METHODS," the content of which is incorporated by reference herein in its entirety; and this application is also a continuation-in-part of U.S. patent application Ser. No. 13/499,038, filed Mar. 29, 2012, titled "QUANTUM DOT-FULLERENE JUNCTION BASED PHOTODETECTORS," which is the national stage of International Application No. PCT/US2010/050731, filed Sep. 29, 2010, titled "QUANTUM DOT-FULLERENE JUNCTION BASED PHOTODETECTORS," which claims the benefit of U.S. Provisional Application No. 61/312,494, filed Mar. 10, 2010, titled "QUANTUM DOT-FULLERENE JUNCTION BASED PHOTODETECTORS," and U.S. Provisional Application No. 61/246,679, filed Sep. 29, 2009, titled "QUANTUM DOT-FULLERENE JUNCTION OPTOELECTRONIC DEVICES;" the contents of which are each incorporated by reference herein in their entireties. This application is related to U.S. patent application Ser. No. 13/499,024, filed Mar. 29, 2012, titled "QUANTUM DOT-FULLERENE JUNCTION OPTOELECTRONIC DEVICES," which is the national stage of International Application No. PCT/US2010/050712, filed Sep. 29, 2010, titled "QUANTUM DOT-FULLERENE JUNCTION OPTOELECTRONIC DEVICES," which claims the benefit of U.S. Provisional Application No. 61/312,494, filed Mar. 10, 2010, titled "QUANTUM DOT-FULLERENE JUNCTION BASED PHOTODETECTORS," and U.S. Provisional Application No. 61/246,679, filed Sep. 29, 2009, titled "QUANTUM DOT-FULLERENE JUNCTION OPTOELECTRONIC DEVICES;" the contents of which are each incorporated by reference herein in their entireties.

TECHNICAL FIELD

The present invention relates generally to optical upconversion devices and related systems and methods, and more particularly to upconversion devices capable of converting electromagnetic energy in the short-wavelength infrared range to electromagnetic energy in the visible range.

BACKGROUND

Both commercial and military markets currently exist for imaging devices such as hand-held, helmet-mounted, and rifle-mounted scopes that integrate night vision or thermal imaging capabilities. There are several shortcomings to the existing technology. Night vision scopes use image intensifier tubes (IITs), which amplify low levels of visible light and produce "green" night vision images. IITs have the benefit of a relatively simple system with an integrated device that both detects and displays the image. However these scopes are susceptible to being blinded by ambient visible light ("blooming"). When background illumination is not sufficient, a near infrared illuminator (usually a laser) may be used to provide more reflected light. But these illuminators are easily seen by other cameras, even silicon-based cameras that are not designed for night vision. Most importantly, the IIT-based imager must be completely changed out for a traditional scope for daytime operation. Alternatively, thermal imaging scopes use a thermal camera to acquire a digital image that it then displays on an electronic display. A significant benefit is that this device is simply an add-on to a standard rifle scope, where the displayed thermal image is placed in line with the existing scope. This allows the night vision function to be quickly added or removed as conditions require. However, the camera/process/display architecture requires separate imaging, processing, and display systems, which consumes additional power. The thermal imaging components are generally quite expensive, and reflected light images are often easier to use to identify objects and therefore preferred over thermal images.

A photodetector may form the basis of an imaging device such as, for example, a digital camera capable of producing still photographs and/or video streams from an observed scene. The imaging device in such applications typically includes a light-sensitive focal plane array (FPA) composed of many photodetectors and coupled to imaging electronics (e.g., read-out chips). The photodetector of a typical digital camera is based on silicon technology. Silicon digital cameras have offered outstanding performance at low cost by leveraging Moore's Law of silicon technology improvement. The use of silicon alone as the light-absorbing material in such cameras, however, limits the efficient operation of these cameras in the infrared spectrum. Silicon is therefore not useful in the portion of the electromagnetic spectrum known as the short-wavelength infrared (SWIR), which spans wavelengths from ~1.0 to 2.5 µm. The SWIR band is of interest for night vision applications where imaging using night glow and reflected light offers advantages over the longer thermal infrared wavelengths. Moreover, SWIR imaging is useful, for example, in military surveillance and commercial security surveillance applications and is considered to have technological advantages over MWIR and LWIR imaging, but thus far has been limited to use in high-performance military applications due to the high costs associated with traditional design and fabrication approaches. Additionally, while detector arrays exhibiting good sensitivity to incident IR radiation have been developed based on a variety of crystalline semiconductors, such arrays conventionally have been required to be fabricated separately from the read-out chips or other electronics utilized in the imaging device. Conventionally, after separately fabricating a detector and a read-out chip, these two components are subsequently bonded together by means of alignment tools and indium solder bumps, or other flip-chip or hybridization techniques to form an FPA. This also adds to fabrication complexity and expense.

Conventionally, photodetector devices and other optoelectronic devices have utilized bulk and thin-film inorganic semiconductor materials to provide p-n junctions for separating electrons and holes in response to absorption of photons. In particular, electronic junctions are typically formed by various combinations of intrinsic, p-type doped and n-type doped silicon. The fabrication techniques for such inorganic semiconductors are well-known as they are derived from many years of experience and expertise in microelectronics. Detectors composed of silicon-based p-n junctions are relatively inexpensive when the devices are small, but costs scale approximately with detector area. Moreover, the bandgap of Si limits the range of IR sensitivity to ~1.1 µm. Group III-V materials such as indium-gallium-arsenide ($In_xGa_yAs$, $x+y=1$, $0 \leq x \leq 1$, $0 \leq y \leq 1$), germanium (Ge) and silicon-germanium (SiGe), have been utilized to extend detection further into the IR but suffer from more expensive and complicated fabrication issues.

More recently, quantum dots (QDs), or nanocrystals, have been investigated for use in optoelectronic devices because various species exhibit IR sensitivity and their optoelectronic properties (e.g., band gaps) are tunable by controlling their size. Moreover, QD layers may be formed by relatively low-cost solution-based processes and deposited by low-cost processes such as spin-coating, printing, etc., as described in above-referenced U.S. Patent Pub. Nos. 2012/0241723 and 2012/0223291. Thus far, however, optoelectronic devices incorporating QDs have typically exhibited less than optimal performance due to factors such as low carrier mobility and short diffusion length.

To leverage the low cost and SWIR spectral sensitivity of QD detectors for low light level imaging a straightforward method of amplifying a QD detector signal is needed. Furthermore tying the output of this amplification stage to a device that emits light in the visible spectral region would allow the creation of low cost imaging system that is simple and straightforward like that of an IIT. Unlike an IIT, however, such a device would be sensitive to SWIR light, not suffer from blooming, could be quickly added or removed from an existing rifle scope, and may be suitable for day or night use. Furthermore it would offer the detection capabilities of indium gallium arsenide detectors without InGaAs's high costs and without the added power requirements that come with the circuitry used in a digital camera.

The reference Jun Chen, Dayan Ban, Michael G. Helander, Zheng-Hong Lu, and Philip Poole, "Near-Infrared Inorganic/Organic Optical Upconverter with an External Power Efficiency of >100%," *Advanced Materials*, 2010, 22, 4900-4904, is incorporated by reference herein. The reference discloses an upconversion device with gain, composed of an $In_xGa_{1-x}As$ phototransistor and an OLED visible emitter. The phototransistor provides both detection and gain in a single two-terminal component. This has the advantage of simplicity in architecture, as the two terminals may be connected on the bottom and top of the layer stack, respectively. However it limits gain control and design flexibility between the gain unit and the detector unit.

The reference Franky So, Do Young Kim, Jae Woong Lee, Bhabendra K. Pradhan, "A method and apparatus for detecting infrared radiation with gain," WO2013/003850 A2, is incorporated by reference herein. The reference discloses an upconversion device with gain. The detector in So et al. is a different type than in Chen et al., but is similar in using a two-terminal device that acts as both the detector and gain element, and is connected in series with an LED.

The reference Ken-ichi Nakayama, Shin-ya Fujimoto, and Masaaki Yokoyama, "Improvement in the on/off ratio of a vertical-type metal-base organic transistor by heat treatment in air," *Organic Electronics*, 2009, 10, 543-546, is incorporated by reference herein. The reference discloses a method for fabricating a vertical channel thin film transistor (TFT) at low temperature in a thin film stack, known as a metal base organic transistor (MBOT). The gain and on/off ratio of this device substantially exceed values that have been demonstrated previously for this device type. The demonstrated device has a collector, a first TFT active region, a base, a second TFT active region, and a collector, with the collector, base, and emitter electrodes arranged in a vertical stack.

Therefore, there is a need for low-cost, integrated SWIR-to-Vis upconversion devices that detect visible to SWIR images and upconvert them to visible images in real time.

SUMMARY

To address the foregoing problems, in whole or in part, and/or other problems that may have been observed by persons skilled in the art, the present disclosure provides methods, processes, systems, apparatus, instruments, and/or devices, as described by way of example in implementations set forth below.

According to one implementation, an upconversion device includes: a thin-film photodiode (PD) comprising a PD cathode, a PD anode, and a PD active region between the PD anode and the PD cathode, wherein at least one of the PD cathode and the PD anode is transparent to incident photons in the short-wavelength infrared (SWIR) or SWIR-visible range, and the PD active region comprises a quantum dot (QD) layer and is configured for outputting an electrical signal in response to receiving the incident photons; and a thin-film light emitting diode (LED) electrically communicating with the PD and comprising an LED anode, an LED cathode, and an LED active region configured for outputting visible photons in response to receiving the electrical signal, wherein at least one of the LED anode and the LED cathode is transparent to the visible photons outputted by the LED active region.

According to another implementation, an imaging device includes: the upconversion device; input optics configured for directing photons to the PD. The imaging device may also include output optics configured for collecting photons emitted from the LED. The imaging device may also include optics configured for creating an image plane at a distance from the upconversion device.

According to another implementation, a method for fabricating an upconversion device includes: forming a thin-film photodiode (PD) comprising a PD cathode, a PD anode, and a PD active region disposed between the PD cathode and the PD anode, wherein at least one of the PD cathode and the PD anode is transparent to incident photons in the short-wavelength infrared (SWIR) or SWIR-visible range, and the PD active region comprises a quantum dot (QD) layer and is configured for outputting an electrical signal in response to receiving the incident photons; and forming a thin-film light-emitting diode (LED) comprising an LED anode, an LED cathode, and an LED active region configured for outputting visible photons in response to receiving the electrical signal, wherein at least one of the LED anode and the LED cathode is transparent to the visible photons outputted by the LED active region.

In some embodiments, the PD and the LED are stacked in a vertical configuration.

According to another embodiment, the upconversion device includes a gain element configured for amplifying the signal from the PD and outputting the amplified signal to the LED in response to application of an external bias voltage.

In some embodiments, the PD, the gain element, and the LED are stacked in a vertical configuration.

In some embodiments, the gain element includes three or more terminals.

Other devices, apparatus, systems, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims.

BRIEF DESCRIPTION OF THE DRAWINGS

The invention can be better understood by referring to the following figures. The components in the figures are not necessarily to scale, emphasis instead being placed upon illustrating the principles of the invention. In the figures, like reference numerals designate corresponding parts throughout the different views.

DETAILED DESCRIPTION

Figure 1:
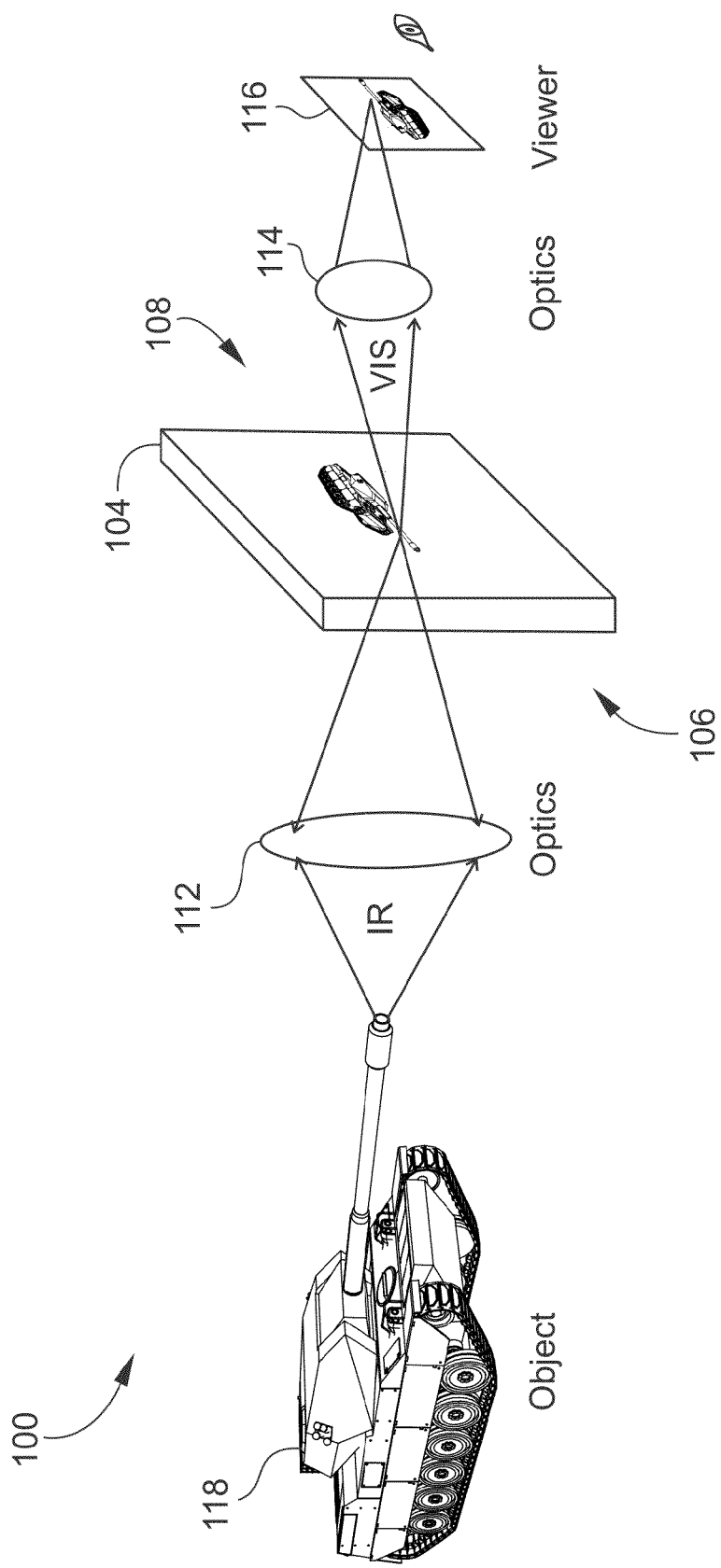
FIG. 1 is a schematic view of an example of an optical system according to some embodiments.

As used herein, the term "optoelectronic device" generally refers to any device that acts as an optical-to-electrical transducer or an electrical-to-optical transducer, including photodiodes (PDs) and light-emitting diodes (LEDs). Such devices may be based on a junction formed by a pair of two different types of semiconductors (e.g., an n-type and a p-type material, or an electron acceptor and an electron donor material). In a PD, when a photon's energy is higher than the band gap value of the semiconductor, the photon can be absorbed in the semiconductor and the photon's energy excites a negative charge (electron) and a positive charge (hole). For the excited electron-hole pair to be successfully utilized in an external electrical circuit, the electron and the hole must first be separated before being collected at and extracted by respective opposing electrodes. This process is called charge separation and is required for photoconductive effects to occur. If the charges do not separate they can recombine and thus not contribute to the electrical response generated by the device. In an LED, electrons and holes are injected into the semiconductor region from the respective electrodes under the influence of an applied bias voltage. One of the semiconductor layers is selected for its light-emitting properties. Radiative recombination of the injected electrons and holes causes the light emission in this layer. Optoelectronic devices are generally described in U.S. Patent Pub. Nos. 2012/0241723 and 2012/0223291, the contents of both of which are incorporated by reference herein in their entireties.

As used herein, the term "fullerene" refers to the buckminsterfullerene $C_{60}$ as well as other forms of molecular carbon, such as $C_{70}$, $C_{84}$, and similar cage-like carbon structures, and more generally may range from 20 to several hundreds of carbon atoms, i.e., $C_n$ where n is 20 or greater. The fullerene may be functionalized or chemically modified as desired for a specific purpose such as, for example, improving solubility or dispersability or modifying the electrical properties of the fullerene. The term "fullerene" may also refer to endohedral fullerenes wherein a non-carbon atom or atomic cluster is enclosed in the carbon cage. The term "fullerene" may also refer to fullerene derivatives. A few non-limiting examples of fullerene derivatives are [6,6]-phenyl-$C_{61}$-butyric acid methyl ester (PCBM) and phenyl-$C_{61}$-butyric acid cholestryl ester (PCBCR). The term "fullerene" may also refer to blends of the previously mentioned forms of fullerenes.

As used herein, the term "quantum dot" or "QD" refers to a semiconductor nanocrystal material in which excitons are confined in all three spatial dimensions, as distinguished from quantum wires (quantum confinement in only two dimensions), quantum wells (quantum confinement in only one dimension), and bulk semiconductors (unconfined). Also, many optical, electrical and chemical properties of the quantum dot may be strongly dependent on its size, and hence such properties may be modified or tuned by controlling its size. A quantum dot may generally be characterized as a particle, the shape of which may be spheroidal, ellipsoidal, or other shape. The "size" of the quantum dot may refer to a dimension characteristic of its shape or an approximation of its shape, and thus may be a diameter, a major axis, a predominant length, etc. The size of a quantum dot is on the order of nanometers, i.e., generally ranging from 1-1000 nm, but more typically ranging from 1-100 nm, 1-20 nm or 1-10 nm. In a plurality or ensemble of quantum dots, the quantum dots may be characterized as having an average size. The size distribution of a plurality of quantum dots may or may not be monodisperse. The quantum dot may have a core-shell configuration, in which the core and the surrounding shell may have distinct compositions. The quantum dot may also include ligands attached to its outer surface, or may be functionalized with other chemical moieties for a specific purpose.

As used herein, the term "electronic heterojunction" refers to two layers of dissimilar materials juxtaposed and in direct contact with each other. One layer serves as an electron donor while the other layer serves as an electron acceptor, such as may be utilized to form a photodiode. In addition to photodetectors, an "electronic heterojunction" is also employed in an LED device, where one layer serves as a light-emissive layer in response to exciton decay, or the returning of an exciton to its unexcited state.

For purposes of the present disclosure, the spectral ranges or bands of electromagnetic radiation are generally taken as follows, with the understanding that adjacent spectral ranges or bands may be considered to overlap with each other to some degree: Ultraviolet (UV) radiation may be considered as falling within the range of about 10-400 nm, although in practical applications (above vacuum) the range is about 200-400 nm. Visible radiation may be considered as falling within the range of about 380-760 nm. Infrared (IR) radiation may be considered as falling within the range of about 750-100,000 nm. IR radiation may also be considered in terms of sub-ranges, examples of which are as follows. Short-wave IR (SWIR) radiation may be considered as falling within the range of about 1,000-3,000 nm. Medium-wave IR (MWIR) radiation may be considered as falling within the range of about 3,000-5,000 nm. Long-wave IR (LWIR) radiation may be considered as falling within the range of about 8,000-12,000 nm.

As used herein, unless otherwise specified, the term "transparent" means that a given material is able to efficiently pass at least those photons having wavelengths in the SWIR range or the Vis-SWIR range (e.g., about 380 to about 3,000 nm).

As described by way of examples below, certain embodiments disclosed herein provide an integrated upconversion device that senses light in the SWIR or Vis-SWIR range on one side of the device, amplifies the signal, and instantaneously emits visible light in a proportional amount on the other side. When integrated into an optical system the upconversion device may be utilized in various applications such as, for example, night vision applications. All functions, including detection, signal amplification, and display, are performed by a thin film stack fabricated using low-cost processes. Moreover, no external processing is required. The only signals to or from the device are low power (e.g., less than about 12V DC) bias lines. Such embodiments may include low-cost, efficient PDs fabricated by quantum dot photodiode (QDP) nanotechnology.

FIG. 1 is a schematic view of an example of an optical system 100 according to some embodiments. The optical system 100 includes an optical upconversion device 104. The upconversion device 104 is generally structured as a thin-film three-dimensional (3D, or "vertical") stack of optoelectronic components, as described further below. The stack has an input side 106, an output side 108, and a thickness between the input side 106 and output side 108. The optical system 100 may further include input optics 112 on the input side 106, and output optics 114 on the output side 108. The input optics 112 may be one or more components (e.g., lenses) configured for collecting SWIR light, or SWIR and visible light from an object 118 and transmitting the light to an image plane on the input side 106. The output optics 114 may be one or more components (e.g., lenses) configured for collecting from the output side 108 visible light produced by the upconversion device 104 and refocusing the light at an image plane 116 at a distance from the upconversion device 104. The output optics 114 may be configured for displaying a visible image to a user of the optical system 100, or on a viewing screen in a projection configuration. It will be understood that the optical system 100 may further include a housing (not shown) enclosing the foregoing components. The structure of the housing will depend on the type of product in which the optical system 100 is implemented (e.g., helmet, firearm, etc.).

Figure 2:
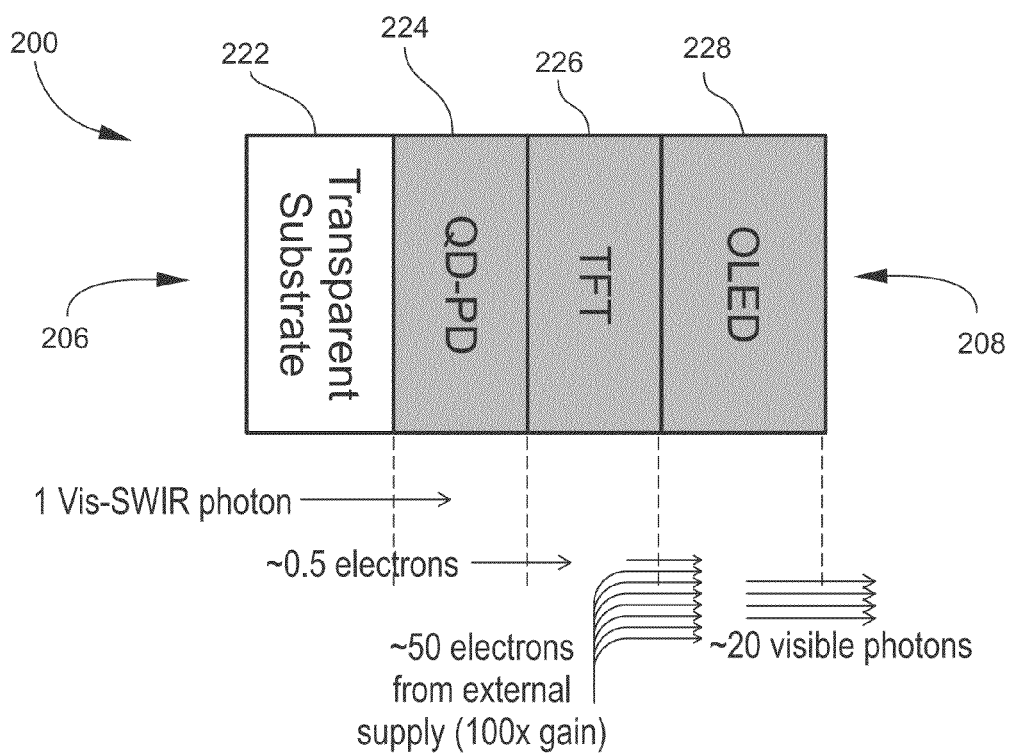
FIG. 2 is a schematic view of an example of an optical upconversion device according to some embodiments.

FIG. 2 is a schematic view of an example of an optical upconversion device 200 according to some embodiments. The upconversion device 200 generally includes thin-film components arranged in a vertical stack between an input side 206 and an output side 208. In the present embodiment, the upconversion device 200 includes a transparent substrate 222, a photodiode (PD) 224 disposed on the substrate 222, a gain element (or gain device) 226 disposed on the PD 224, and a light emitting diode (LED) 228 disposed on the gain element 226. These components are described in more detail below. Generally, the PD 224 receives SWIR range or Vis-SWIR range photons propagating through the substrate 222 and generates an electrical output current (electrons) proportional to the intensity of the incident photons. The gain element 226 receives the output current and amplifies it using an external voltage bias. In some embodiments, the gain element 226 is or includes a transistor such as, for example, a field-effect transistor (FET) or a thin-film transistor (TFT). In some embodiments, the gain element 226 is a multi-terminal gain element such as, for example, a three-terminal gain element, as described by examples below. The LED 228 receives the amplified current and generates visible light, which in an optical system may be further processed by downstream optics as described above. The upconversion device 200 thus converts a SWIR or Vis-SWIR image into a visible image of longer wavelengths.

As one specific, yet non-limiting example, the PD 224 converts incoming photons to electrical current with about 50% efficiency, the gain element 226 amplifies this signal with about 100× gain, and the LED 228 emits visible photons using the amplified current with about 50% efficiency. As a related example, a single incoming photon may be converted to about 0.5 electrons, which may be amplified to about 50 electrons, which may be converted to about 25 visible photons.

As described further below, in some embodiments the PD 224 may be based on an active quantum dot (QD) layer. The gain element 226 may include an organic active layer, and may be a three-terminal transistor that operates similar to a bipolar junction transistor (BJT). Alternatively the gain element 226 may include an organic active layer, and may be a three-terminal transistor that operates similar to a FET. The gain element 226 may be configured as a thin film stack with vertical current flow, so that a current source on one (e.g., bottom) electrode is amplified in the current output on another (e.g., top) electrode. The LED 228 may include an organic active layer; that is, the LED may be an OLED.

Figure 3A:
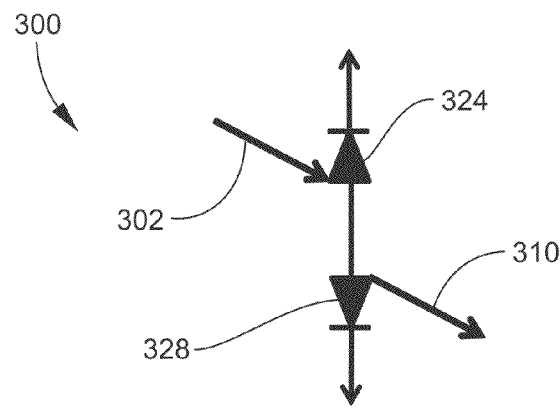
FIG. 3A is a schematic circuit diagram of an example of an optical upconversion device according to some embodiments.

FIG. 3A is a schematic circuit diagram of an example of an optical upconversion device 300 according to some embodiments. The upconversion device 300 includes a QD-based PD 324 and an LED 328. The PD 324 and the LED 328 are in electrical communication such that during operation photo-generated current is transmitted from the PD 324 to the LED 328. For example, the upconversion device 300 may be fabricated such that a PD anode of the PD 324 communicates with an LED anode of the LED 328. The upconversion device 300 is configured for receiving incident IR and/or visible light 302 and emitting visible light 310.

Figure 3B:
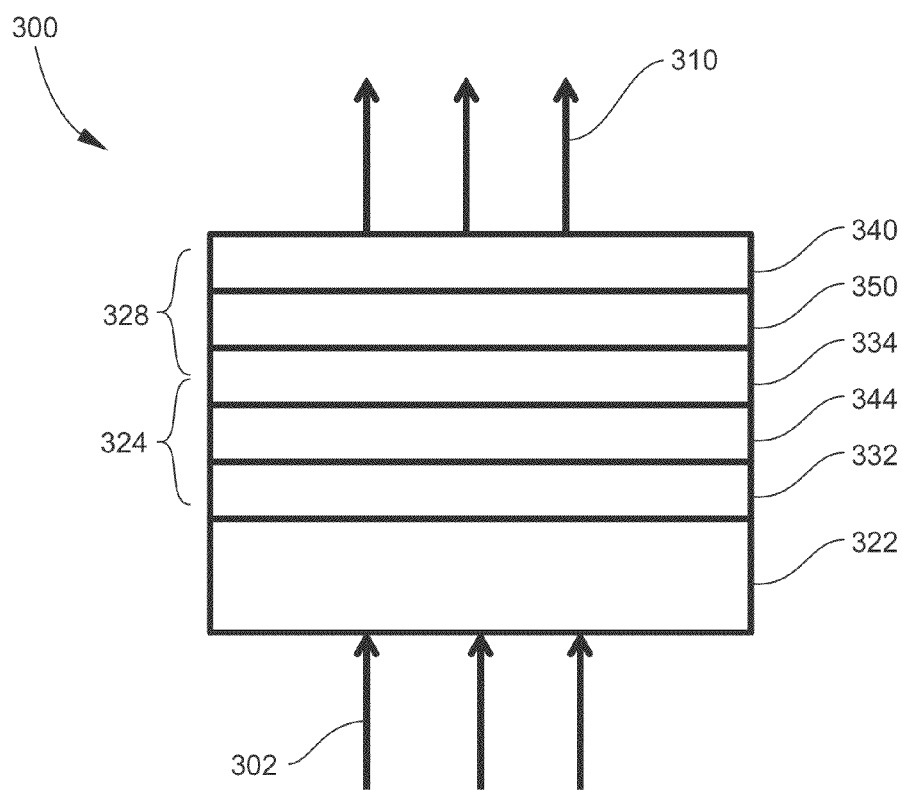
FIG. 3B is a schematic cross-sectional view of an example of an optical upconversion device according to some embodiments.

FIG. 3B is a schematic cross-sectional view of an example of the upconversion device 300 according to some embodiments. The upconversion device 300 includes the PD 324 and the LED 328. The PD 324 includes a transparent substrate 322 through which incident IR and/or visible light 302 passes into the PD 324. The PD 324 further includes a transparent PD cathode 332 disposed on the substrate 322, a PD active region 344 disposed on the PD cathode 332, and a PD anode 334 disposed on the PD active region 344. In the illustrated embodiment the PD anode 334 also serves as the LED anode, while in other embodiments the PD anode and LED anode may be separate or distinct elements. The LED 328 includes the LED anode (PD anode 334). The LED 328 further includes an LED active region 350 disposed on the PD anode/LED anode 334, and a transparent LED cathode 340 disposed on the LED active region 350. During operation, visible light 310 exits the upconversion device 300 through the LED cathode 340. According to the present disclosure, the PD active region 344 includes at least one active QD layer. The PD active region 344 and/or the LED active region 350 may include one or more layers of different materials, as appreciated by persons skilled in the art.

Figure 4:
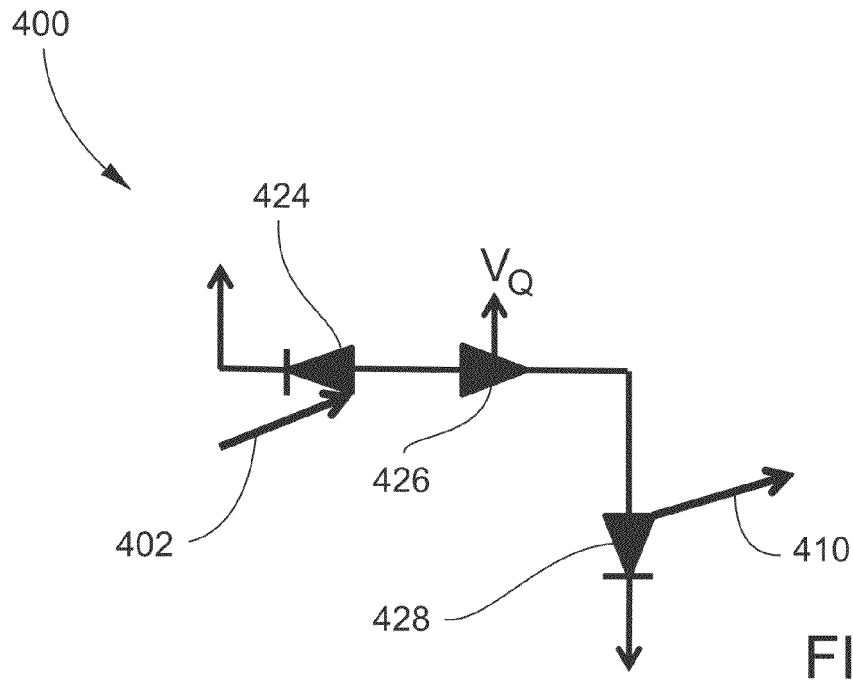
FIG. 4 is a schematic circuit diagram of an example of an optical upconversion device according to some embodiments.

FIG. 4 is a schematic circuit diagram of an example of an optical upconversion device 400 according to some embodiments. The upconversion device 400 includes a PD 424, an LED 428, and a gain device 426 communicating with the PD 424 and the LED 428. The gain device 426 may be or include a transistor or it may be a more complex set of amplifier circuitry with an input, an output, an external bias, and a gain adjustment. In contrast to above-referenced Chen, et. al. the use of a multi-terminal gain device in conjunction with a separate PD rather than a two terminal phototransistor overcomes the slow response time associated with phototransistors, provides adjustable gain, and allows the independent design of the PD 424 and the gain device 426. The upconversion device 400 is configured for receiving incident IR and/or visible light 402 at the PD 424 and emitting visible light 410 from the LED 428.

Figure 5:
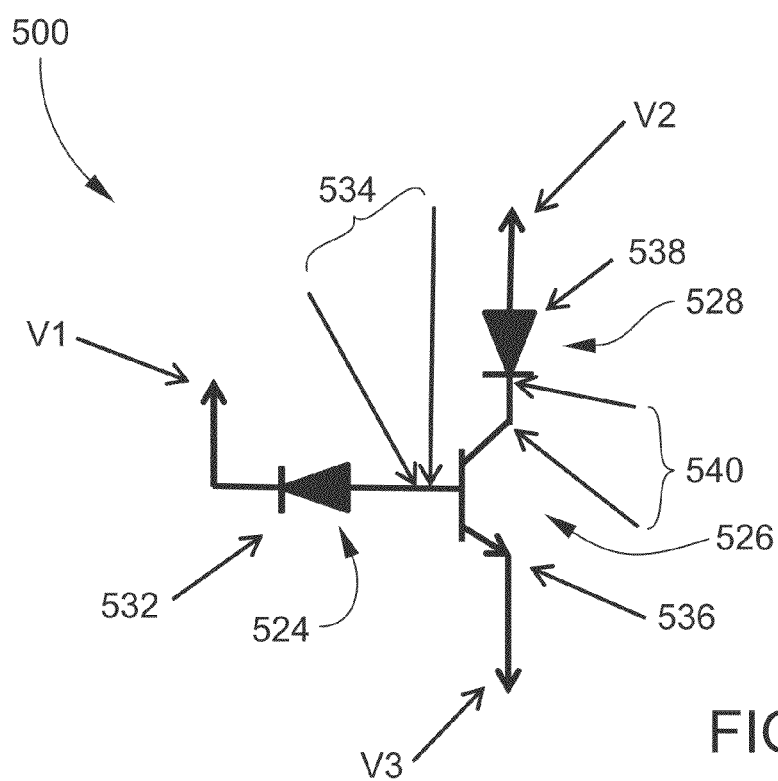
FIG. 5 is a schematic circuit diagram of an example of an optical upconversion device according to some embodiments.

FIG. 5 is a schematic circuit diagram of an example of an optical upconversion device 500 according to some embodiments. The upconversion device 500 includes a PD 524, a gain element in the form of a TFT 526, and an LED 528. The PD 524 includes (or communicates with) a PD cathode 532 and a PD anode/TFT base 534. The PD anode/TFT base 534 may represent an electrode common to both the PD 524 and the TFT 526, or two physically distinct electrodes (PD anode and TFT base) in electrical communication with each other. The TFT 526 also includes (or communicates with) a TFT collector/LED cathode 540 and a TFT emitter 536. The TFT collector/LED cathode 540 may represent an electrode common to both the TFT 526 and the LED 528, or two physically distinct electrodes (TFT emitter and LED anode) in electrical communication with each other. The LED 528 also includes an LED anode 538. The PD cathode 532, LED anode 538, and TFT emitter 536 may be externally biased. Gain occurs because photocurrent between the PD cathode 532 and TFT emitter 536 modulates a larger current between the TFT collector/LED cathode 540 and TFT emitter 536, which then drives the LED 528. Three voltage sources, V1, V2, and V3 may be connected to the circuit and may be adjusted to optimize the circuit performance. V1 is connected to the PD cathode 532, V2 is connected to the LED anode 538, and V3 is connected to the TFT emitter 536.

The TFT 526 shown in FIG. 5 is depicted as a NPN bipolar junction transistor (BJT) but other gain elements are known in the field and may be used. Examples include a field effect transistor (FET), a PNP BJT, an n-type metal base organic transistor (MBOT), or a p-type MBOT. As appreciated by persons skilled in the art, some of these elements may require reversing the polarity of the PD 524 and/or the LED 528.

Figure 6:
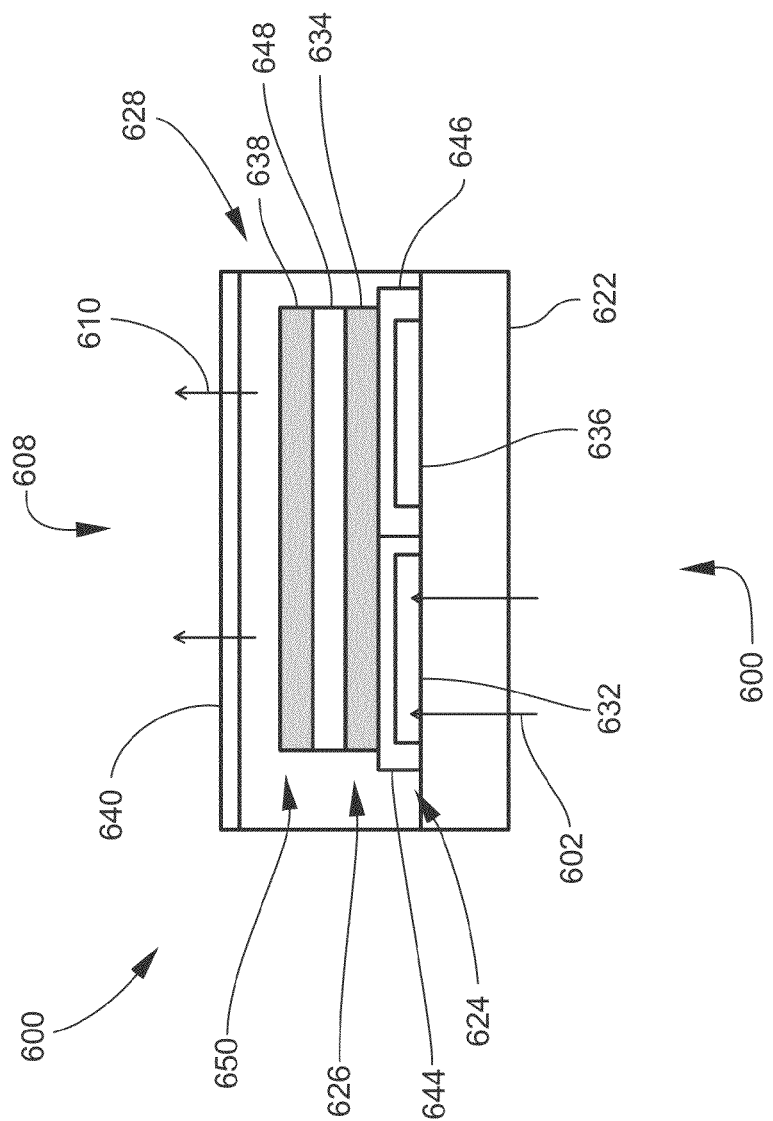
FIG. 6 is a schematic cross-sectional view of another example of an optical upconversion device according to some embodiments.

FIG. 6 is a schematic cross-sectional view of another example of an optical upconversion device 600 according to some embodiments. FIG. 6 represents a single pixel unit, such that in practice the upconversion device 600 may include an array of such units. The upconversion device 600 generally includes thin-film components arranged in a vertical stack between an input side 606 and an output side 608. In the present embodiment, the upconversion device 600 includes a transparent substrate 622, a PD 624 disposed on the substrate 622, a TFT 626 disposed on the PD 624 (or on both the substrate 622 and the PD 624, as illustrated), and an LED 628 disposed on the TFT 626.

The PD 624 includes a PD cathode 632 disposed on the substrate 622, a PD active region 644 disposed on the PD cathode 632, and a PD anode/TFT base 634 disposed on the PD active region 644. The PD active region 644 includes a plurality of layers, including an electron donor layer and an electron acceptor layer forming a rectifying heterojunction. The electron donor layer is a QD layer as described below.

The TFT 626 includes a TFT emitter 636, a first TFT active region 646 disposed on the TFT emitter 636, the PD anode/TFT base 634 (a common electrode layer shared with the PD 624 in the present embodiment) disposed on the first TFT active region 646, a second TFT active region 648 disposed on the PD anode/TFT base 634, and a TFT collector/LED cathode 638 disposed on the second TFT active region 648. The first TFT active region 646 may include two or more layers forming a base-emitter junction. The second TFT active region 648 may include two or more layers forming a base-collector junction. One or more active layers in one or both TFT active regions 646 and 648 may include organic compounds such as, for example, carbon fullerenes in the first TFT active region 646 and N,N0-dimethyl-3,4,9,10-perylene tetracarboxylic diimide (Me-PTC) in the second TFT active region 648. In some embodiments, the PD anode/TFT base 634 and TFT collector/LED cathode 638 are externally biased.

In some embodiments, the TFT 626 is a metal base organic transistor (MBOT) in which the base/emitter first TFT active region is an organic compound such as carbon fullerenes, the base is a metal such as aluminum (Al), and base/collector second TFT active region is an organic compound such as Me-PTC. Other embodiments of the TFT 626 include other vertical-channel transistors; or FETs including those formed by amorphous silicon (Si) thin films, organic semiconductors, oxides of zinc, indium, gallium, tin, or alloys thereof.

The LED 628 includes the TFT collector/LED cathode 638 (a common electrode layer shared with the TFT 626 in the present embodiment), an LED active region 650, and an LED anode 640. The LED active region 650 may include one or more active layers. In some embodiments, the LED active region 650 includes an emissive (electroluminescent) layer and one or more transport layers. The emissive layer may include a dopant to enhance the efficiency of charge recombination, or change the emission wavelength of the LED 628. One or more of the active layers may include organic compounds, which may be small molecules or polymers such as Alq3 or N,N'-bis(1-naphthyl)-N,N'-diphenyl-1,1'-biphenyl-4,4'-diamine (NPB). Small molecules are typically formed and deposited by vacuum deposition. Polymers may be processed in solution and deposited by spin coating, printing, etc. The LED anode 640 is a transparent electrode such as a transparent conductive oxide (e.g., indium tin oxide, or ITO) or other optically transparent, electrically conductive layers known in the art.

In operation, IR and/or visible light 602 is incident on the PD cathode 632. As electrical current flows from the TFT collector/LED cathode 638 to the LED anode 640, electrons and holes recombine to form excitons, which quickly decay back to an equilibrium state. Visible photons 610 are emitted during this relaxation process at a wavelength dependent on the difference in the energy levels between the highest occupied molecular orbitals (HOMO) and lowest unoccupied molecular orbitals (LUMO).

As illustrated, in some embodiments components of the PD 624 and the TFT 626 may both be formed on the substrate 622 in a side-by-side arrangement. The PD cathode 632 and the TFT emitter 636 may be transparent conductors formed by any patterning process now known or later developed. Examples of transparent conductors are described below. The PD cathode 632 and the TFT emitter 636 may, for example, be configured as stripes that are biased at the edge of the substrate 622. The PD active region 644, TFT active regions 646 and 648, PD anode/TFT base 634 and TFT collector/LED cathode 638 may be patterned either physically (e.g., shadow mask), lithographically, or by other means such as printing. The patterning of the PD anode/TFT base 634 and TFT collector/LED cathode 638 limits current flow in the vertical direction (i.e., prevents current from the PD 624 from causing LED emission elsewhere) and therefore defines the resolution of both the imager and display. If the conductivity of the TFT base/PD anode 634 and the TFT collector/LED cathode 638 are sufficiently low then these layers may be unpatterned, or patterned in stripes that are parallel or orthogonal to the PD anode 632 and TFT emitter 636. The LED active region 650 and LED anode 640 may not require patterning at the pixel level.

The upconversion device 600 illustrated in FIG. 6 may be a complete device that includes a single PD 624 and associated components. Alternatively, the upconversion device 600 may include many PDs, in which case the illustrated upconversion device 600 may be considered as representing one cell or pixel that is part of a larger array of cells or pixels. Thus, in some embodiments the upconversion device 600 may include an array of PDs arranged on a common plane. The PDs may be arranged as a linear array, i.e., only along a single row or column, or may be arranged as a two-dimensional array commonly referred to as a focal plane array or FPA. Any number of PDs may be provided in the array in accordance with the desired resolution of the upconversion device 600. The number of columns do not need to match the number of rows, i.e., the upconversion device 600 may include an M×N array of PDs where M does not equal N. The array may have any shape (e.g., square, rectilinear, polygonal, circular, elliptical, etc.). Moreover, individual cells or pixels may have any shape (e.g. square, rectangular, etc.).

In some embodiments, the upconversion device 600 may be packaged or encapsulated (not shown) as needed by any suitable means known to persons skilled in the art.

Figure 7:
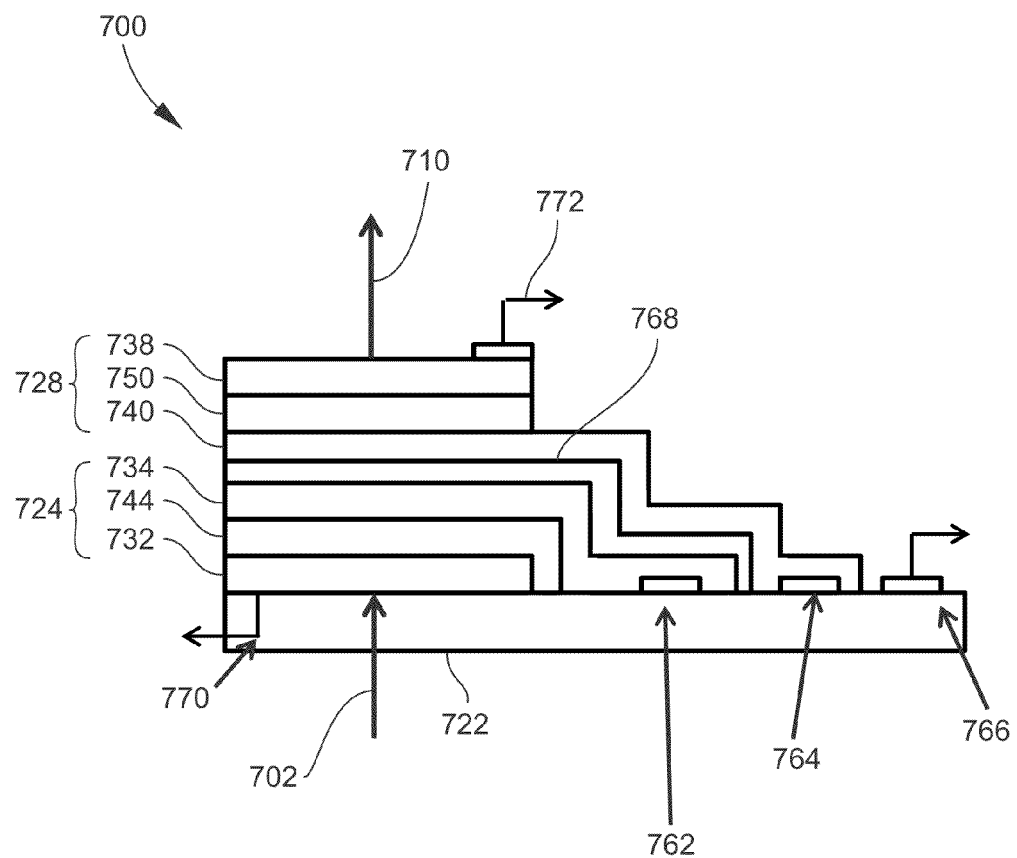
FIG. 7 is a schematic cross-sectional view of an example of an optical upconversion device according to some embodiments.

FIG. 7 is a schematic cross-sectional view of an example of an optical upconversion device 700 according to some embodiments. The upconversion device 700 includes a PD 724 disposed on a semiconductor substrate 722 and an LED 728 disposed on the PD 724. A variety of semiconductor materials may be suitable for the semiconductor substrate 722, one non-limiting example being Si. The semiconductor substrate 722 incorporates amplifier circuitry used as a gain stage between the PD 724 and the LED 728. In the illustrated embodiment, the semiconductor substrate 722 includes a gain element input (terminal) 762, a gain element output (terminal) 764, and an external bias or power terminal 766 formed on (i.e., on and/or in) the bulk of the semiconductor substrate 722. The PD 724 includes a PD cathode 732 disposed on the semiconductor substrate 722, a PD active region 744 disposed on the PD cathode 732, and a PD anode 734 disposed on the PD active region 744. In this embodiment, an insulating layer (insulator) 768 is disposed on the PD anode 734 (i.e., disposed between the PD 724 and the LED 728) to electrically isolate the PD 724 and the LED 728. The LED 728 includes an LED anode 740 disposed on the insulator 768, an LED active region 750 disposed on the LED anode 740, and an LED cathode 738 disposed on the LED active region 750. In some embodiments, the upconversion device 700 may provide connections 770 and 772 at the PD cathode 732 and LED cathode 738, respectively, for external bias or power.

In this embodiment the PD anode 734 is electrically connected to the input 762 of the amplifier circuitry. The output 764 of the amplifier circuitry is connected to the LED anode 740. During operation incident IR and/or visible light 702 passes through the semiconductor substrate 722 into the PD 724. This allows the semiconductor substrate 722 to also act as an optical long pass filter, only passing wavelengths of light longer than approximately 1.1 µm. Visible light 710 is emitted from the LED cathode 738.

Figure 8:
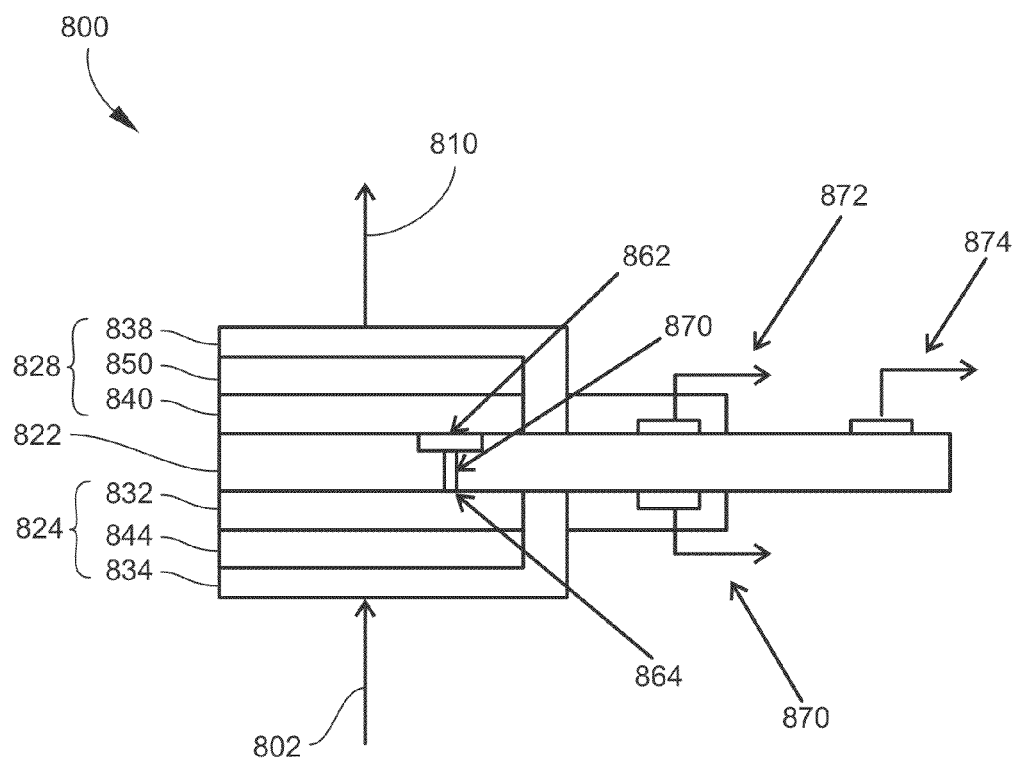
FIG. 8 is a schematic cross-sectional view of an example of an optical upconversion device according to some embodiments.

FIG. 8 is a schematic cross-sectional view of an example of an optical upconversion device 800 according to some embodiments. The upconversion device 800 is built on a semiconductor (e.g., Si) substrate 822 with a PD 824 fabricated on the input side of the semiconductor substrate 822 and an LED 828 fabricated on the output side of the semiconductor substrate 822. Here the semiconductor substrate 822 incorporates gain circuitry, including a gain element input (terminal) 864, a gain element output (terminal) 862, and an external bias or power terminals 870, 872, and 874 formed on (i.e., on and/or in) the bulk of the semiconductor substrate 822. The semiconductor substrate 822 also includes through-substrate vias 870 (e.g., through-Si vias, or TSVs), and associated contact pads if necessary, to provide electrical communication between the input side and output side of the semiconductor substrate 822.

In the illustrated embodiment, the PD 824 includes a PD anode 832 disposed on the input side of the semiconductor substrate 822, a PD active region 844 disposed on the PD anode 832, and a PD cathode 834 disposed on the PD active region 844. The LED 828 includes an LED anode 840 disposed on the output side of the semiconductor substrate 822, an LED active region 850 disposed on the LED anode 840, and an LED cathode 838 disposed on the LED active region 850. Thus, in this embodiment the semiconductor substrate 822 is disposed between the PD anode 832 and the LED anode 840. The LED anode 840 communicates with the output 862 of the amplifier circuitry, and the PD anode 832 communicates with the input 864 of the amplifier circuitry by way of the via 870. The PD cathode 834 and the LED cathode 838 respectively communicate with the external bias or power terminals 870 and 872, and the amplifier circuitry communicates with the external bias or power terminal 874. During operation, incident IR and/or visible light 802 is received by the PD cathode 834, and visible light 810 is emitted from the LED cathode 838.

As one non-limiting example of the performance of an upconversion device as taught herein, the PD (with the QD based active region described below) may provide about 20 to 50% quantum efficiency (electrons per incident photon), and the LED (with an organic electroluminescent layer) may provide about 20 to 50% quantum efficiency (emitted photons per injected electron). The TFT may achieve current amplification of 100×. Thus, in this example, a conservative scenario is about four visible photons emitted for each incident photon, and with further development and optimization significant gains in performance may be achieved.

As one non-limiting example of the performance of an upconversion device such as illustrated in FIG. 7 or 8, the amplification circuitry may be designed to provide gain values of $10^6$ or more, with a concomitant increase in the ratio in emitted to incoming photons.

Regarding application to night vision, it is useful to consider the intensity of ambient illumination in the SWIR range relative to the visible wavelengths. Comparing a detector that is sensitive from about 400 to 1800 nm (such as the QD-based PD) to the eye, the following TABLE shows the approximate photocurrent for a 100% efficient detector under full moon and no moon conditions, and shows that a system that provides SWIR sensitivity would provide ~425× higher intensity than a system that is sensitive to only visible light, assuming comparable gain and efficiency. Further, the system would provide ~70% more photons on a moonless night than are visible by the eye during a full moon.

TABLE

Approximate photocurrent for a 100% efficient Vis + SWIR detector compared to human vision under different moonlight conditions.

|  | Visible-Only (nA/cm$^2$) | Visible + SWIR (nA/cm$^2$) |
|---|---|---|
| Full Moon | ~10 | ~100 |
| No Moon | ~0.04 | ~17 |

In some embodiments of upconversion devices described herein, the primary photon-absorbing element of the PD is one or more layers of quantum dots (QDs). QDs are advantageous because they function at relatively high temperatures such that the associated upconversion device does not require elaborate cooling means, and generally exhibit low dark currents and consequently good signal-to-noise ratio. Moreover, QDs may be produced utilizing relatively low-cost and easily implemented processing techniques, as in the example of solution-processed colloidal QDs. Furthermore, the electrical and optical properties of QDs are tunable by, for example, controlling their size and/or composition during synthesis. For example, as the size of certain QDs increases the QDs become sensitive to longer wavelengths. Thus, the size and/or composition of QDs may be selected such that a given QD layer absorbs photons up to a maximum wavelength of interest.

In certain examples described below, each QD layer may be formed in direct contact with an electron acceptor layer, such as a layer of fullerenes to form an electronic heterojunction. The fullerene layer may also be a photon-absorbing layer. For convenience in the present disclosure, the resulting QD-fullerene bilayer structure is referred to as a heterostructure. The PD may include a single QD-fullerene heterostructure or a series of two or more vertically stacked QD-fullerene heterostructures. In the case of more than one heterostructure, the heterostructures may be separated from each other by charge-carrier transporting layers or other types of intervening layers, or may share a QD layer or fullerene layer with each other, i.e., may comprise a series of vertically stacked, alternating QD and fullerene layers. In other examples, the electron acceptor layer may be composed of other semiconducting materials such as zinc oxide, tin oxide, or alloys thereof. In yet other examples, the QD layer may act as an electron acceptor layer, and the heterojunction may be formed from a complementary electron donor layer such as copper phthalocyanine or similar organic compounds, or from a QD layer that acts as an electron donor. In yet other examples, the PD may be composed of QDs that operate as a photoconductive detector, a Schottky detector, or other known configurations to one skilled in the art.

Figure 9A:
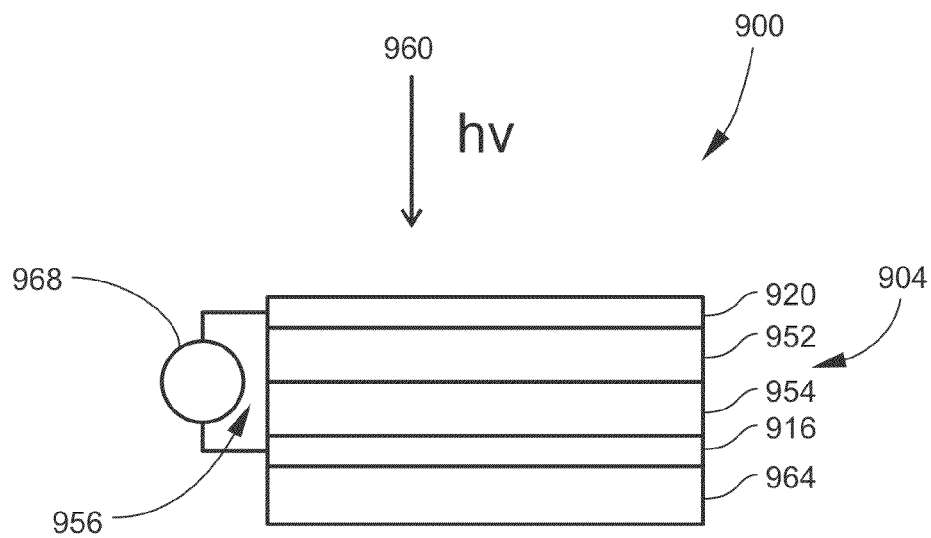
FIG. 9A is a schematic cross-sectional view of an example of a photodiode device according to some embodiments.

FIG. 9A is a schematic cross-sectional view of an example of a photodiode (PD) 900 according to certain implementations of the present disclosure. Generally, the photodiode 900 includes a heterostructure 904 interposed between an upper electrode 920 and a lower electrode 916. It will be understood that the terms "upper" and "lower" are arbitrary in that no limitation is placed on the orientation of the photodiode 900. The heterostructure 904 includes a fullerene layer 952 directly interfaced with a quantum dot (QD) layer 954 to form an electronic heterojunction 956. In this QD-fullerene heterostructure 904, the QD layer 954 serves as an electron donor (or hole transporting) layer and the fullerene layer 952 serves as an electron acceptor (or electron transporting) layer. The QD layer 954 and the fullerene layer 952 are photosensitive, forming excitons in response to absorption of light 960. In the present example, the QD layer 954 is disposed on the electrode 916 (serving as an anode), the fullerene layer 952 is disposed on the QD layer 954, and the electrode 920 (serving as a cathode) is disposed on the fullerene layer 952. In this example, the electrode 920 is intended to transmit incident light 960 and thus is composed of a transparent material. In this case, the electrode 920 may correspond to the appropriate PD electrode (anode or cathode) of one or more of the embodiments described above. The other electrode 916 may also be transparent but is not required to be in the presently illustrated arrangement. The electrode 916 may be formed on any suitable substrate 964, followed by deposition of the other layers.

As appreciated by persons skilled in the art, the photodiode 900 may include additional layers (not shown in FIG. 9A) that facilitate rapid propagation of the holes and electrons to their respective electrodes 916 and 920 and/or reduce the probability of electron-hole recombination.

In operation, electromagnetic radiation 960 passing through the electrode 920 is absorbed in the QD layer 954 and the fullerene layer 952, thus inducing the photogeneration of excitons (electron-hole pairs) in the QD layer 954 and the fullerene layer 952. The excitons are separated into electrons and holes at or near the junction between the QD layer 954 and the fullerene layer 952 or by electric fields present in the respective layers. The electrons are transported through the fullerene layer 952 to the electrode 920 and the holes are transported through the QD layer 954 to the electrode 916. As a result, current flows from the electrode 916 to underlying signal processing circuitry that may be provided with the substrate 964. To enhance this process, the photodiode 900 may be placed in signal communication with a voltage source 968 via electrical lines (wires, etc.) respectively connected to the electrode 920 and the electrode 916 by appropriate attachment means.

The QD layer 954 includes a plurality of quantum dots (QDs). In some embodiments, the QD layer 954 may have a thickness ranging from 5 nm to 5 µm. In implementations typical to the present teachings, the QDs are composed of inorganic semiconductor materials. In one particularly advantageous yet non-limiting example, the QDs are lead sulfide (PbS) or lead selenide (PbSe) crystals or particles. More generally, QDs may be selected from various Group II-VI, Group I-III-VI, Group III-V, Group IV, Group IV-VI, and Group V-VI materials.

The QDs may be formed by various known techniques such as, for example, colloidal synthesis, plasma synthesis, vapor deposition, epitaxial growth, and nanolithography. The size, size distribution, shape, surface chemistry or other attributes of the QDs may be engineered or tuned to have desired properties (e.g., photon absorption and/or emission) by any suitable technique now known or later developed. The QD layer 954 may be formed on an underlying layer (e.g., the electrode 916 or an intervening layer) by any suitable method, particularly solution-based methods such as various known coating and printing methods, or doctor blading.

Figure 9B:
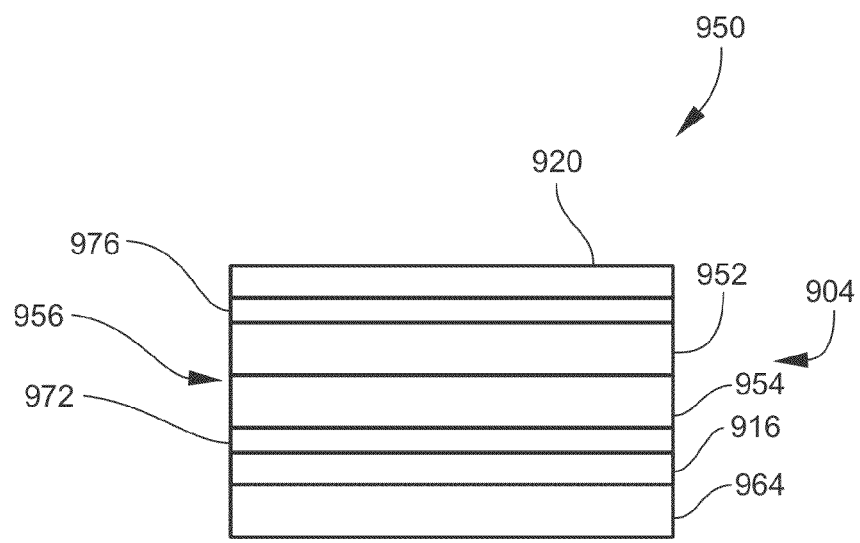
FIG. 9B is a schematic cross-sectional view of another example of a photodiode device according to some embodiments.

FIG. 9B is a schematic cross-sectional view of another example of a photodiode 950 according to certain implementations of the present disclosure. In this implementation, one or more additional layers of materials are provided to improve a performance-related attribute such as quantum efficiency. For example, a hole blocking layer 976 may be interposed between the fullerene layer 952 and the electrode 920 to prevent holes from traveling toward the electrode 920 and possibly combining with a free electron near the electrode surface. The hole blocking layer 976 may be composed of any organic or inorganic material suitable for providing the hole blocking function. Examples include, but are not limited to, inorganic compounds such as $TiO_2$ or ZnO, organic compounds such as 2,9-dimethyl-4,7-diphenyl-1,10-phenanthroline (bathocuproine or BCP), 4,7-diphenyl-1,10-phenanthroline (bathophenanthroline or BPhen), 2,9-bis(naphthalen-2-yl)-4,7-diphenyl-1,10-phenanthroline (NBPhen), or a metal chelate complex such as tris-8-hydroxy-quinolinato aluminum (Alq3), and chemical relatives and derivatives of the foregoing.

In other implementations, in addition or as an alternative to the hole blocking layer 976, the photodiode 950 may include an electron blocking layer 972 interposed between the electrode 916 and the QD layer 954 to prevent electrons from traveling toward the electrode 916 and possibly combining with a hole. The electron blocking layer 972 may be composed of any organic or inorganic material suitable for providing the electron blocking function. Examples include, but are not limited to, molybdenum trioxide ($MoO_3$), tungsten trioxide ($WO_3$), copper oxide ($CuO_x$), nickel oxide ($NiO_x$), a phthalocyanine such as copper phthalocyanine (CuPc) or tin phthalocyanine (SnPc) (but not limited to metal-Pc compounds), 4,4',4''-tris(3-methylphenylphenylamino)-triphenylamine (m-MTDATA), N,N'-bis(1-naphthyl)-N,N'-diphenyl-(1,1'-biphenyl)-4,4'-diamine (α-NPD), and chemical relatives and derivatives of the foregoing. Additionally, QDs that have potential energies that are different than the QDs in layer 554 may be employed as the electron blocking layer 972. The thickness of the electron blocking layer 972 will generally depend on its composition. In some examples, the thickness of the electron blocking layer 972 ranges from 1 nm to 100 nm.

Depending on its composition and the properties of the semiconductor layer with which it is interfaced, a hole blocking layer 976 and/or an electron blocking layer 972 such as those noted above may also serve as an exciton blocking layer to confine photogenerated excitons to the region of the heterojunction where they need to be dissociated and to keep them away from the electrode/semiconductor interfaces. Anode-side and/or cathode-side exciton blocking layers may also be provided in addition to the hole blocking layer 976 and/or the electron blocking layer 972. As appreciated by persons skilled in the art, the composition of the exciton blocking layer may be dictated by whether it is positioned adjacent to an anode (e.g., the electrode 916) or a cathode (e.g., the electrode 920), so that the exciton blocking layer does not impair hole transport or electron transport in the relevant direction.

The unique QD-fullerene heterojunction 956 constitutes a substantial improvement over previously known heterojunctions. In particular, the QD-fullerene heterojunction 956 exhibits increased light absorption and light absorption at wavelengths not typically accessible by other heterojunctions. A consequence of the improved light absorption is a higher photocurrent density. The heterojunction 956 exhibits more efficient charge separation of photogenerated excitons and more efficient charge carrier collection as compared to devices based on other types of heterojunctions. In one example, the improvement includes the post-deposition treatment of the QD layer 954 to improve the charge transport properties of this layer 954. This technique increases charge separation efficiency, increases charge extraction efficiency, lowers the series resistance, and allows the use of a thicker QD layer 954 without reducing efficiency. Another improvement is the use of an electron blocking layer 972 as described above, which increases charge separation efficiency by reducing exciton recombination at the electrode-QD layer interface, and helps to limit the deleterious effects of defects in the QD layer 954. The electron blocking layer 972 functions as a tunneling junction or an ohmic junction in the extraction of photogenerated holes and enables high-efficiency photodetection while maintaining very low dark currents and thus very high signal-to-noise ratio.

PDs such as described herein may be configured to be responsive to any combination of IR, visible and UV ranges as desired for a particular application. The spectral responsiveness depends on the QDs utilized in terms of size, composition, doping, or other chemical or surface modification (if any), and other properties or characteristics. As previously noted, the type of QDs utilized in a given layer may be uniform or may be an ensemble of different types of QDs as needed to achieve a desired performance. In some examples, a photodiode as provided according to the present disclosure is responsive to incident photons at wavelengths ranging from 250-1700 nm. The use of appropriately sized PbS or similar QDs is a specific example of the foregoing. In other examples, the photodiode may be responsive to the range of 250-2400 nm. Moreover, a given photodetector may exhibit a range of quantum efficiencies dependent on the incident wavelength. For example, the photodetector may exhibit an external quantum efficiency of 15% or greater, while in other examples may exhibit an external quantum efficiency of 25%-95%.

Optoelectronic devices implementing a QD-fullerene heterojunction 956 as described herein have exhibited performance characteristics demonstrating some of the advantages of this heterojunction. In one example, a photodiode device was fabricated for testing purposes based on the structure illustrated in FIG. 9A and included the electron blocking layer 972 illustrated in FIG. 9B. In the test device, the substrate 964 was transparent. A 2 nm thick $MoO_3$ electron blocking layer 972 was deposited on a glass substrate 964 coated with an ITO electrode 916. The QD layer 954 was formed on the electron blocking layer 972 by spin coating a solution of butylamine-capped PbS QDs in octane with a concentration of 50 mg/ml. After allowing excess solvent to evaporate, the resulting QD layer 954 had a thickness of approximately 80 nm. The QD layer 954 was then treated by immersion in 5% formic acid in acetonitrile for 5 minutes. The fullerene layer 952 was then formed on the QD layer 954 by thermal evaporation of a 50 nm layer of $C_{60}$ fullerenes. A 13 nm layer of BCP was then formed on the fullerene layer 952 by thermal evaporation to serve as a hole blocking layer 976. An electrode 920 was then deposited on the BCP consisting of a 50 nm thick layer of Al followed by a 50 nm thick layer of Ag. A laser source was configured to produce irradiance at various power levels (mW). Using this laser source, the glass-side of the photodiode device was irradiated with monochromatic 980-nm illumination, with the sample at ambient temperature and without protection from ambient oxygen and moisture. The area of the electrode 920 was measured using a calibrated microscope to be ~0.8 $mm^2$.

Figure 10:
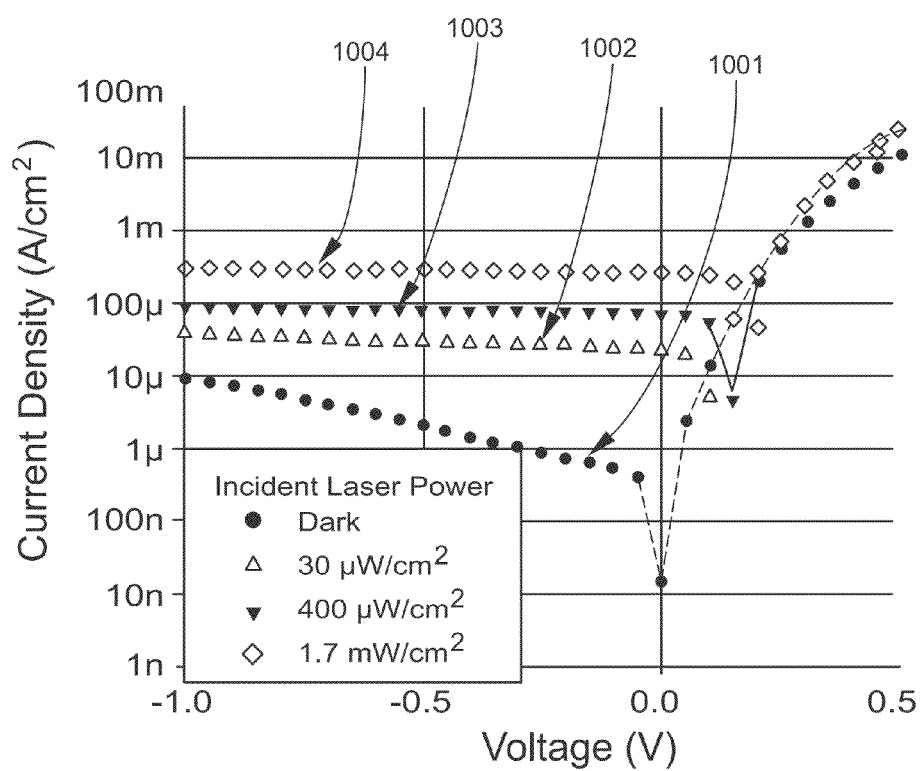
FIG. 10 is a set of plots of current density as a function of voltage under dark and illuminated conditions of different powers for an example of a photodiode device fabricated according to some embodiments.

FIG. 10 is a set of plots of current density as a function of voltage under dark and illuminated conditions of different optical powers. Specific I-V curves were taken under illumination conditions as follows: 1001 (Dark); 1002 (30 $\mu W/cm^2$); 1003 (400 $\mu W/cm^2$); and 1004 (1700 $\mu W/cm^2$). The current was measured as a function of applied voltage using a Keithley 2400 SourceMeter power supply/meter to produce the I-V data in FIG. 10.

This sample photodiode device exhibited quantum efficiencies (ratio of measured electrons to incident photons) of about 21% at 980 nm.

It will be understood by one skilled in the art that embodiments that include an anode and cathode; an emitter, base, and collector; or a source, gate, and drain; may be reconfigured such that the polarities of individual components are reversed, by reconfiguring the polarities of other components in a circuit to provide the same function. The present invention intends to be inclusive of any such reconfiguration.

In general, terms such as "communicate" and "in . . . communication with" (for example, a first component "communicates with" or "is in communication with" a second component) are used herein to indicate a structural, functional, mechanical, electrical, signal, optical, magnetic, electromagnetic, ionic or fluidic relationship between two or more components or elements. As such, the fact that one component is said to communicate with a second component is not intended to exclude the possibility that additional components may be present between, and/or operatively associated or engaged with, the first and second components.

It will be understood that various aspects or details of the invention may be changed without departing from the scope of the invention. Furthermore, the foregoing description is for the purpose of illustration only, and not for the purpose of limitation—the invention being defined by the claims.

What is claimed is:

1. An upconversion device, comprising:
    a thin-film photodiode (PD) comprising a PD cathode, a PD anode, and a PD active region between the PD anode and the PD cathode, wherein at least one of the PD cathode and the PD anode is transparent to incident photons in the short-wavelength infrared (SWIR) or SWIR-visible range, and the PD active region comprises a quantum dot (QD) layer and is configured for outputting an electrical signal in response to receiving the incident photons; and
    a thin-film light emitting diode (LED) electrically communicating with the PD and comprising an LED anode, an LED cathode, and an LED active region configured for outputting visible photons in response to receiving the electrical signal, wherein at least one of the LED anode and the LED cathode is transparent to the visible photons outputted by the LED active region.

2. The upconversion device of claim 1, comprising at least one of the following:
    the PD active region comprises a heterojunction formed by a first layer and a second layer, the first layer comprising the QD layer and the second layer comprising an electron acceptor material;
    the PD active region comprises a heterojunction formed by a first layer and a second layer, the first layer comprising the QD layer and the second layer comprising an electron acceptor material, wherein the electron acceptor material is selected from the group consisting of fullerene, zinc oxide (ZnO), titanium oxide (TiO$_2$), copper phthalocyanine, and QDs configured for forming a rectifying junction with the QDs of the first layer;
    the QD layer comprises quantum dots having a composition selected from the group consisting of: a Group II-VI material, a Group I-III-VI material, a Group III-V material, a Group IV material, a Group IV-VI material, a Group V-VI material;
    the QD layer comprises quantum dots having a composition selected from the group consisting of: lead sulfide, lead selenide, lead telluride, mercury telluride, and alloys thereof;
    the LED comprises an organic semiconductor material.

3. The upconversion device of claim 1, wherein the PD and the LED are stacked in a vertical configuration, and comprising at least one of the following:
    the PD is disposed on a substrate transparent to incident photons in the short-wavelength infrared (SWIR) or SWIR-visible range;
    the PD cathode is disposed on a substrate transparent to incident photons in the short-wavelength infrared (SWIR) or SWIR-visible range, and the LED cathode is transparent to the visible photons outputted by the LED active region;
    the PD anode and the LED anode are formed as a common electrode between the PD action region and the LED active region.

4. The upconversion device of claim 1, comprising a gain element configured for amplifying the signal from the PD and outputting the amplified signal to the LED in response to application of an external bias voltage.

5. The upconversion device of claim 4, wherein the gain element is a thin-film transistor (TFT) comprising a collector communicating with the LED cathode, a base communicating with the PD anode, an emitter, and a TFT active region, wherein the TFT active region is configured for amplifying the signal from the PD and outputting the amplified signal at the collector in response to application of an external bias voltage at the emitter.

6. The upconversion device of claim 5, wherein the TFT is a vertical-channel transistor, such that the collector, TFT active region, base, and emitter are thin films stacked in a vertical configuration.

7. The upconversion device of claim 6, wherein the vertical-channel transistor is a metal base organic transistor (MBOT).

8. The upconversion device of claim 5, wherein the TFT active region has a configuration comprising at least one of:
    the TFT active region comprises a first TFT active region and a second TFT active region;
    the TFT active region comprises a first TFT active region and a second TFT active region, wherein the first TFT active region comprises fullerenes and the second TFT active region comprises N,N0-dimethyl-3,4,9,10-perylene tetracarboxylic diimide (Me-PTC);
    the TFT active region comprises a material selected from the group consisting of: an organic semiconductor, silicon, zinc oxide, indium oxide, gallium oxide, tin oxide, and alloys thereof.

9. The upconversion device of claim 5, comprising a configuration selected from the group consisting of: the PD anode and the base are formed as a common electrode; the LED cathode and the collector are formed as a common electrode; and both of the foregoing.

10. The upconversion device of claim 5, comprising a substrate, wherein the PD cathode and the emitter are located on the substrate, and further comprising at least one of the following:
    the PD anode and the base are formed as a common electrode, the collector is located between the common electrode and the LED;
    the PD anode and the base are formed as a first common electrode, and the LED cathode and the collector are formed as a second common electrode;
    the PD anode and the base are formed as a first common electrode, the LED cathode and the collector are formed as a second common electrode, and the TFT active region comprises a first TFT active region and a second TFT active region, wherein the first TFT active region is between the emitter and the first common electrode and the second TFT active region is between the first common electrode and the second common electrode.

11. The upconversion device of claim 4, comprising a semiconductor substrate and an electrical insulating layer, wherein the semiconductor substrate comprises gain circuitry communicating with the PD and the LED, the PD is disposed on the semiconductor substrate, the electrical insulating layer is disposed on the PD, and the LED is disposed on the insulating layer in electrical isolation from the PD.

12. The upconversion device of claim 4, comprising a semiconductor substrate comprising an input side, an output side, and gain circuitry communicating with the PD and the LED, wherein the PD is disposed on the input side and the LED is disposed on the output side.

13. The upconversion device of claim 4, wherein the gain element is a field-effect transistor (FET) comprising a source, a gate, a drain, and an FET active region, and the FET active region is configured for amplifying the signal from the PD and outputting the amplified signal at the source in response to application of an external bias voltage at the drain.

14. The upconversion device of claim 13, wherein the PD, the gain element, and the LED comprise thin films stacked in a vertical configuration.

15. The upconversion device of claim 13, wherein the FET is a vertical-channel transistor, such that the source, the TFT active region, the gate, and the drain are thin films stacked in a vertical configuration.

16. An imaging device, comprising:
the upconversion device of claim 1; and
input optics configured for directing photons to the PD.

17. A method for fabricating an upconversion device, the method comprising:
forming a thin-film photodiode (PD) comprising a PD cathode, a PD anode, and a PD active region disposed between the PD cathode and the PD anode, wherein at least one of the PD cathode and the PD anode is transparent to incident photons in the short-wavelength infrared (SWIR) or SWIR-visible range, and the PD active region comprises a quantum dot (QD) layer and is configured for outputting an electrical signal in response to receiving the incident photons; and
forming a thin-film light-emitting diode (LED) comprising an LED anode, an LED cathode, and an LED active region configured for outputting visible photons in response to receiving the electrical signal, wherein at least one of the LED anode and the LED cathode is transparent to the visible photons outputted by the LED active region.

18. The method of claim 17, wherein the PD is formed on a substrate.

19. The method of claim 17, comprising forming a gain element such that the gain element is configured for amplifying the signal from the PD and outputting the amplified signal to the LED in response to application of an external bias voltage wherein the PD anode communicates with the LED anode via the gain element.

20. The method of claim 17, comprising forming the PD, the gain element, and the LED as a three-dimensional stack.

21. The method of claim 20, wherein forming the gain element comprises forming a thin-film transistor (TFT), the TFT comprising a collector communicating with the LED cathode, a base communicating with the PD anode, an emitter, and a TFT active region, wherein the TFT active region is configured for amplifying the signal from the PD and outputting the amplified signal at the emitter in response to application of an external bias voltage at the emitter.

22. The method of claim 21, comprising forming the TFT active region by forming a base-emitter region and a base-collector region on opposing sides of the base, wherein the base-emitter region, the base, and the base-collector region are arranged in a three-dimensional stack.

23. The method of claim 21, comprising at least one of:
forming the PD anode and the base as a common electrode layer;
forming the collector and the LED cathode as a common electrode layer.

24. The method of claim 19, comprising forming a semiconductor substrate comprising gain circuitry communicating with the PD and the LED, and further comprising at least one of:
forming the PD on the semiconductor substrate, forming an electrical insulating layer on the PD, and forming the LED on the insulating layer such that the LED is electrically isolated from the PD;
a forming the PD on an input side of the semiconductor substrate, and forming the LED on an output side of the semiconductor substrate.

25. The method of claim 17, wherein forming the PD comprises depositing the QD layer by depositing a solution comprising a plurality of quantum dots and a solvent.

* * * * *